(12) United States Patent
Sugawara

(10) Patent No.: US 8,450,700 B2
(45) Date of Patent: May 28, 2013

(54) ION SUPPLY DEVICE

(75) Inventor: Yudo Sugawara, Oshu (JP)

(73) Assignee: Tokyo Electron Limited, Tokyo (JP)

(*) Notice: Subject to any disclaimer, the term of this patent is extended or adjusted under 35 U.S.C. 154(b) by 72 days.

(21) Appl. No.: 13/183,933

(22) Filed: Jul. 15, 2011

(65) Prior Publication Data

US 2012/0018649 A1   Jan. 26, 2012

(30) Foreign Application Priority Data

Jul. 21, 2010   (JP) .................................. 2010-164107

(51) Int. Cl.
*H01J 27/02*   (2006.01)
(52) U.S. Cl.
USPC ...................................... 250/423 R; 250/424
(58) Field of Classification Search
USPC ............................................ 250/423 R, 424
See application file for complete search history.

(56) References Cited

U.S. PATENT DOCUMENTS

2010/0044581 A1* 2/2010 Fujita et al. .................. 250/424

FOREIGN PATENT DOCUMENTS

JP   2005-72559 A   3/2005

* cited by examiner

*Primary Examiner* — Michael Logie
(74) *Attorney, Agent, or Firm* — Nath, Goldberg & Meyer; Jerald L. Meyer

(57) ABSTRACT

An ion supply device includes an ion generator for generating ions for removing static electricity, a carrier gas supply unit for supplying to the ion generator a carrier gas for carrying the ions generated in the ion generator, and an ion supply nozzle for blowing the ions and the carrier gas from the ion generator through a blow-off opening toward an electricity removal target from which static electricity is to be removed. A slit is provided at the blow-off opening and has an increased width as the slit gets distant from the electricity removal target. The ion supply nozzle includes an internal flow path and a plurality of internal fins provided at a portion of the internal flow path near the blow-off opening so that the ions and the carrier gas blown from the slit is uniformly distributed along a lengthwise direction of the slit.

4 Claims, 7 Drawing Sheets

ION SUPPLY DEVICE

CROSS-REFERENCE TO RELATED APPLICATIONS

This application is based upon and claims the benefit of priority from Japanese Patent Application No. 2010-164107, filed on Jul. 21, 2010, the entire contents of which are incorporated herein by reference.

TECHNICAL FIELD

The present disclosure relates to an ion supply device and a workpiece processing system provided with the same.

BACKGROUND

In a semiconductor device manufacturing process, various kinds of processing are performed, such as formation of thin films on workpieces, e.g., semiconductor wafers. The semiconductor wafers are conveyed in the course of such processing. Due to the slight contact or sliding contact between individual members during the conveyance, static electricity is prone to being generated in the semiconductor wafers or a wafer boat holding the semiconductor wafers. If static electricity is generated in the semiconductor wafers and thus electrically charging the semiconductor wafers, particles such as dust and the like are likely to adhere onto the semiconductor wafers. This poses a problem in that the yield rate of products gets lowered.

In view of this, it is under study that an electricity removal device for removing static electricity generated in semiconductor wafers is installed in a processing apparatus. For example, JP2005-72559A discloses a substrate processing apparatus including a substrate holding unit for holding a substrate and an electricity removal unit for removing electricity from an atmosphere accommodating the substrate holding unit.

However, in the case that a multiple number of semiconductor wafers to be subjected to such electricity removal exists in a processing apparatus, such as a batch-type vertical processing apparatus, requiring the electricity removal over a wide area, difficulties may occur in uniformly removing static electricity. Thus, demand exists for a device capable of uniformly removing static electricity over a wide area.

SUMMARY

To address the above described circumstances, the object of the present disclosure is to provide an ion supply device capable of uniformly removing static electricity over a wide area. Another object of the present disclosure is to provide a workpiece processing system provided with the ion supply device capable of uniformly removing static electricity over a wide area.

According to a first aspect of the present disclosure, there is provided an ion supply device, including: an ion generator for generating ions for removing static electricity; a carrier gas supply unit for supplying to the ion generator a carrier gas for carrying the ions generated in the ion generator; and an ion supply nozzle for blowing the ions and the carrier gas from the ion generator through a blow-off opening toward an electricity removal target from which static electricity is to be removed, wherein a slit is provided at the blow-off opening, the slit having an increased width as the slit gets distant from the electricity removal target, wherein the ion supply nozzle includes an internal flow path and a plurality of internal fins provided at a portion of the internal flow path near the blow-off opening so that the ions and the carrier gas blown from the slit is uniformly distributed along a lengthwise direction of the slit.

The slit may be formed in an inverted taper shape with a width increasing toward a tip end of the ion supply nozzle.

The ion supply nozzle may be made of at least one material selected from the group consisting of polycarbonate, quartz and polyether ether ketone (PEEK).

The ion generator may be an ionizer.

According to a second aspect of the present disclosure, there is provided a workpiece processing system for processing a workpiece, including: an ion supply device provided in a processing area in which the workpiece is processed, wherein the ion supply device includes: an ion generator for generating ions for removing static electricity; a carrier gas supply unit for supplying to the ion generator a carrier gas for carrying the ions generated in the ion generator; and an ion supply nozzle for blowing the ions and the carrier gas from the ion generator through a blow-off opening toward an electricity removal target from which static electricity is to be removed.

DETAILED DESCRIPTION

An ion supply device of the present disclosure and a workpiece processing system provided with the same will now be described by taking as an example a case where the ion supply device and the workpiece processing system are applied to a processing apparatus shown in FIG. 1.

Figure 1:
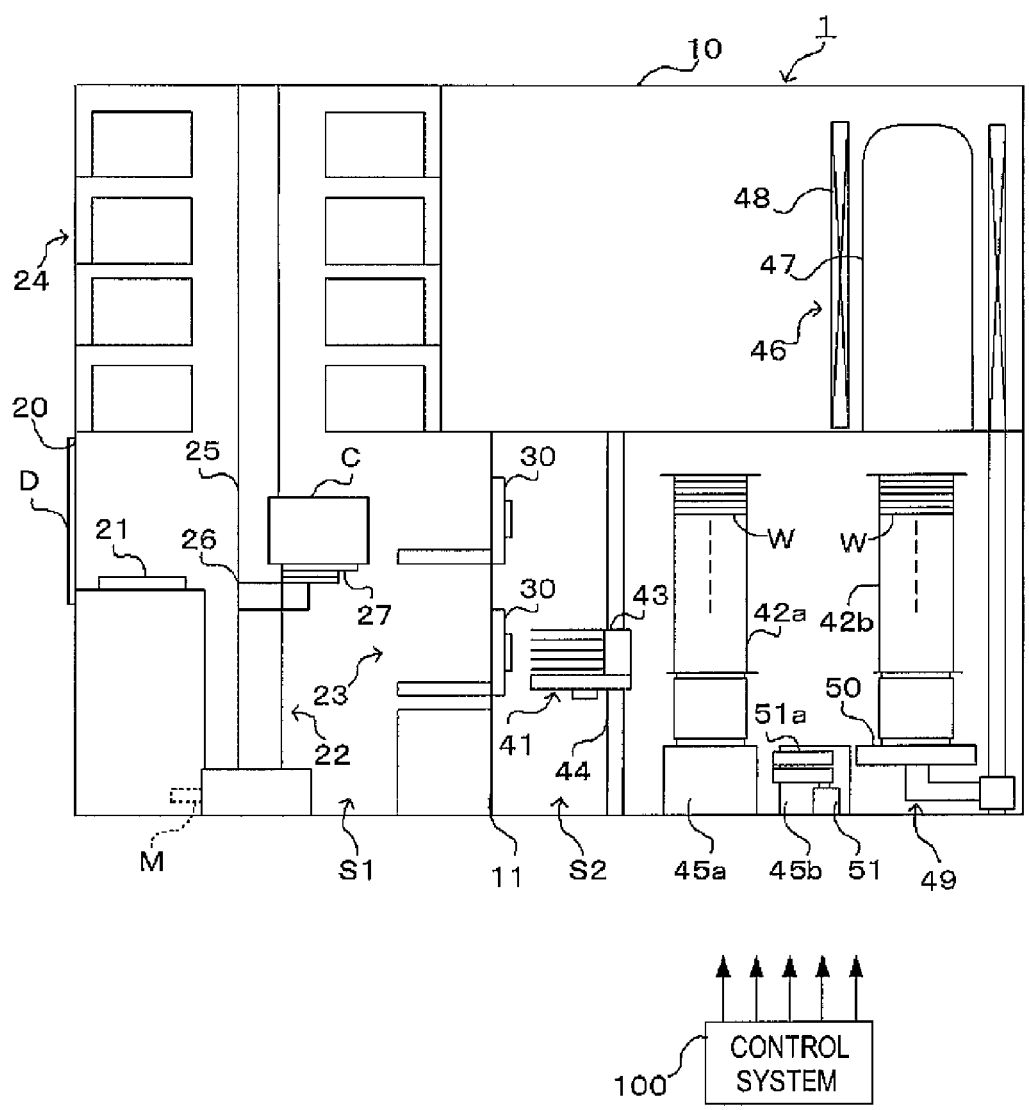
FIG. 1 is a front view showing a processing apparatus according to one embodiment.

Referring to FIG. 1, a processing apparatus 1 according to one embodiment of the present disclosure includes a processing chamber 10 which is divided into a working area S1 and a loading area S2 by a partition wall 11. The working area S1 is an area in which to perform conveyance and storage of a carrier C, i.e., a closed conveying container, for holding therein a plurality of, e.g., twenty five, semiconductor wafers W. The working area S1 is kept at a same atmosphere as the normal atmosphere. On the other hand, the loading area S2 is an area in which the semiconductor wafers W are subjected to a heat treatment, e.g., a film-forming process or an oxidization process. The loading area S2 is kept at an atmosphere of an inert gas, e.g., a nitrogen gas ($N_2$).

In the working area S1, there are provided a load port 21, a carrier conveyor 22, one or more transfer stages 23 and a storage unit 24.

The load port 21 supports the carrier C conveyed into the processing apparatus 1 by an external conveying mechanism (not shown) from a gateway 20 formed in the sidewall of the processing chamber 10. For example, a door D is arranged outside the processing chamber 10 in a position corresponding to the gateway 20. The gateway 20 is configured to be closed and opened by the door D.

The carrier conveyor 22 is arranged between the load port 21 and the transfer stages 23 to convey the carrier C within the work area S1. The carrier conveyor 22 includes a post 25 and a horizontal arm 26 installed on the side surface of the post 25. The post 25 is provided to extend along the vertical direction within the processing chamber 10. The horizontal arm 26 can be moved up and down using a motor M arranged below the post 25. A conveying arm 27 formed of, e.g., an articulated arm, is installed in the horizontal arm 26. The conveying arm 27 can be moved up and down by vertically moving the horizontal arm 26. The conveying arm 27 can be horizontally moved by a motor (not shown). In this manner, the horizontal arm 26 and the motors are configured to vertically and horizontally move the conveying arm 27 to thereby perform delivery of the carrier C.

The transfer stages 23 are arranged on the side of the partition wall 11 facing the working area S1 to support the carrier C conveyed by the carrier conveyor 22. Through the transfer stages 23, the semiconductor wafers W are taken out from the carrier C and transferred into the loading area S2 by a transfer mechanism 42 to be described later. The transfer stages 23 include, e.g., upper and lower transfer stages. The partition wall 11 has openings formed in alignment with the transfer stages 23. Shutters 30 are respectively arranged on the side of the partition wall 11 facing the loading area S2 to function to close the openings.

The storage unit 24 is installed in the upper side of the working area S1 to store the carrier C. The storage unit 24 may include a set of storage racks arranged in, e.g., four rows and two columns. The set of storage racks of the storage unit 24 are installed to interpose the post 25 therebetween.

Figure 2:
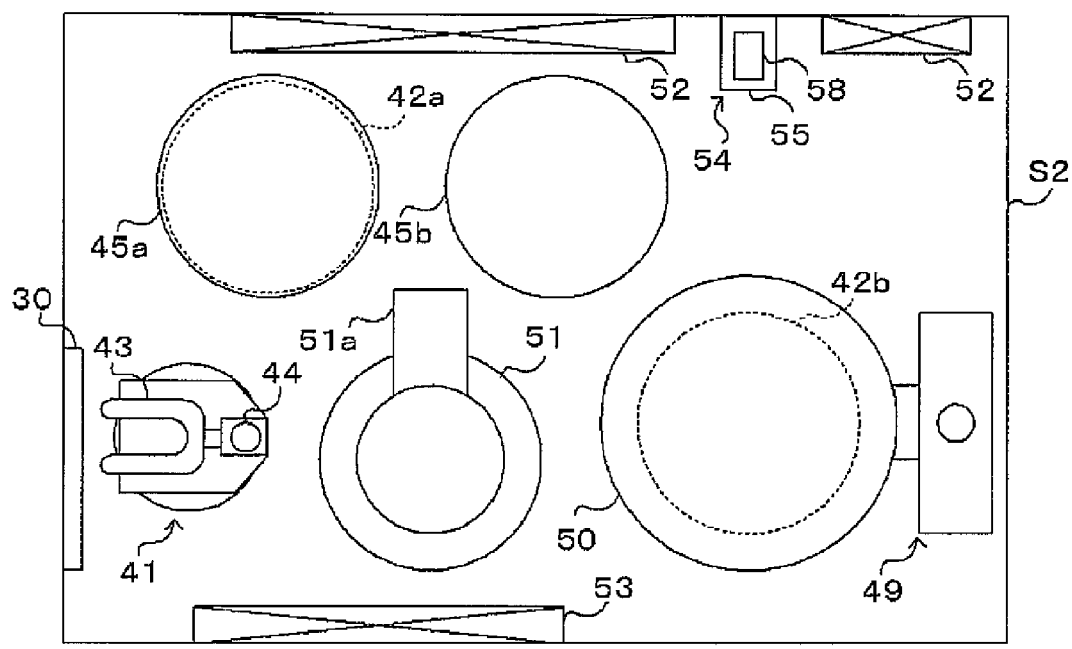
FIG. 2 is a plane view showing the internal structure of a loading area of the processing apparatus shown in FIG. 1.
Figure 3:
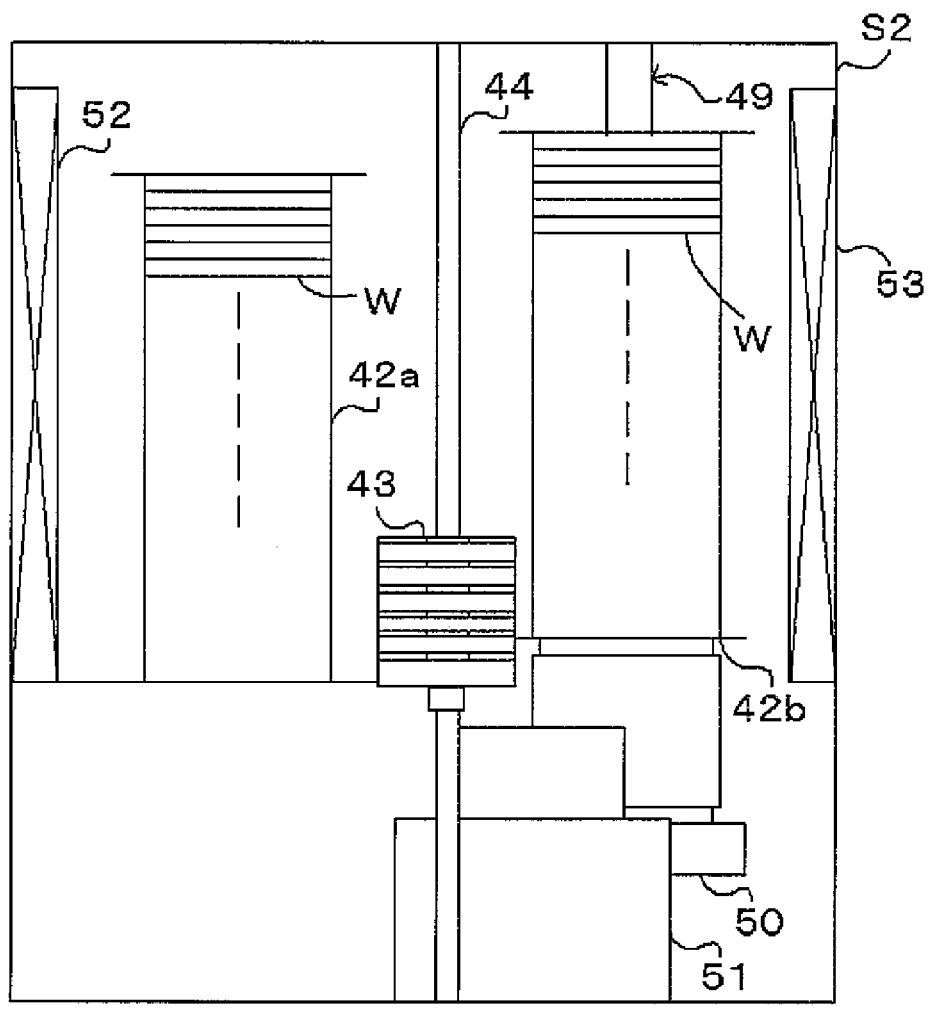
FIG. 3 is a side view showing the internal structure of the loading area of the processing apparatus shown in FIG. 1.

FIG. 2 is a plane view showing the internal structure of the loading area S2 of the processing apparatus. FIG. 3 is a side view showing the internal structure of the loading area S2 of the processing apparatus. As shown in FIGS. 1 to 3, a transfer mechanism 41, boat tables 45 (e.g., 45a and 45b), a boat transfer mechanism 51, filters 52, a gas exhaust port 53 and an ion supply device 54 are arranged within the loading area S2 and a heat treatment furnace 46 is arranged to be connected to the loading area S2.

The transfer mechanism 41 is installed between the shutters 30 and the boat tables 45. The transfer mechanism 41 performs delivery of the semiconductor wafers W between the carrier C placed on the transfer stages 23 and the wafer boats 42 (e.g., 42a and 42b) placed on the boat tables 45. The transfer mechanism 41 includes an extendible/retractable arm 43 capable of transferring, e.g., a plurality of semiconductor wafers W at one time. The transfer mechanism 41 can be rotated about a vertical axis by a motor (not shown) and can be moved up and down along a lift shaft 44.

The boat tables 45 are tables for supporting the wafer boats 42. In the present embodiment, the boat tables 45 may include two boat tables, i.e., a transfer boat table 45a for supporting one of the wafer boats 42 for performing delivery of the semiconductor wafers W using the transfer mechanism 41 and a standby boat table 45b for supporting another one of the wafer boats 42 in a standby state. Likewise, the wafer boats 42 include a plurality of, e.g., two, wafer boats 42a and 42b which are used alternately. The number of the wafer boats 42 may be one or more than two. In an instance where the number of the wafer boats 42 is one, there may be no need to include the boat tables 45. In this case, the semiconductor wafers W are transferred between the carrier C and the wafer boat 42 which is loaded into and unloaded from the heat treatment furnace 46.

The heat treatment furnace 46 includes a quartz-made cylindrical processing vessel 47 having a bottom opening and a roof. A cylindrical heater 48 is arranged around the processing vessel 47 to heat the semiconductor wafers W existing within the processing vessel 47. A cap 50 that can be moved up and down by a lift mechanism 49 is arranged below the processing vessel 47. If the cap with the wafer boat 42 (in FIG. 1, 42b) holding the semiconductor wafers W placed thereon is moved up, the semiconductor wafers W (together with the wafer boat 42b) are loaded into the processing vessel 47. Upon loading the semiconductor wafers W, the bottom opening of the processing vessel 47 is hermetically sealed by the cap 50.

The boat transfer mechanism 51 is installed near the boat tables 45. The boat transfer mechanism 51 includes an extendible/retractable arm 51a and transfers the wafer boat 42 between the cap 50 and the boat tables 45.

The filters 52 are installed on one side surface of the loading area S2. The filters 52 are connected to a gas supply source (not shown) so that a gas, e.g., an air or an inert gas such as an $N_2$ gas, can be supplied from the gas supply source into the loading area S2 through the filters 52. Thus, a clean air or a clean inert gas is blown from the filters 52 in the horizontal direction, thereby forming a side flow of clean gas at all times.

The gas exhaust port 53 is provided on the side surface opposing to the side surface on which the filters 52 are installed. The gas exhaust port 53 is a port for discharging therethrough the gas existing within the loading area S2. The clean air or clean inert gas supplied from the filters 52 is discharged through the gas exhaust port 53 together with particles, e.g., dust, existing within the loading area S2. Thus, the loading area S2 is kept clean. Further, in some embodiments, the clean air or clean inert gas discharged from the gas exhaust port 53 may be reused by returning the same to the filters 52 through a duct.

As shown in FIG. 2, the ion supply device 54 is arranged between the filters 52 arranged on one side surface of the loading area S2. The configuration of the ion supply device 54 is shown in FIG. 4.

Figure 4:
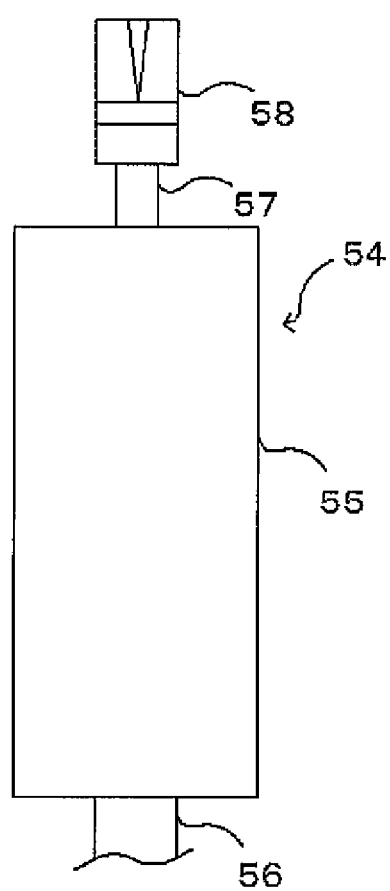
FIG. 4 is a view showing the schematic structure of an ion supply device.

Referring to FIG. 4, the ion supply device 54 includes an ion generator 55 as a main body of the ion supply device 54, a carrier gas supplying flow path 56 through which a carrier gas is supplied to the ion generator 55, an ion flow path 57 extending from the ion generator 55, and an ion supply nozzle 58 connected to the tip end portion of the ion flow path 57.

The ion generator 55 is formed of, e.g., an ionizer for generating positive ions and negative ions. Examples of the ionizer include a double DC-type bar-shaped ionizer for simultaneously generating positive ions and negative ions, a pulse DC-type ionizer for alternately generating positive ions and negative ions in a specific time interval, an AC-type bar-shaped ionizer for alternately generating positive ions and negative ions at a high speed and a soft X-ray ionizer for generating positive ions and negative ions through the irradiation of X-rays.

The carrier gas supplying flow path 56 connects the ion generator 55 to a carrier gas supply source (not shown). The carrier gas supplying flow path 56 is configured to supply therethrough a carrier gas from the carrier gas supply source to the ion generator 55. The carrier gas serves to carry ions. An inert gas, e.g., an $N_2$ gas, may be used as the carrier gas.

The ion flow path 57 is connected to the ion generator 55 and the ion supply nozzle 58. The ion flow path 57 is configured to supply therethrough to the ion supply nozzle 58 the positive ions and the negative ions which are generated in the ion generator 55 and carried by the carrier gas.

Figure 5A:
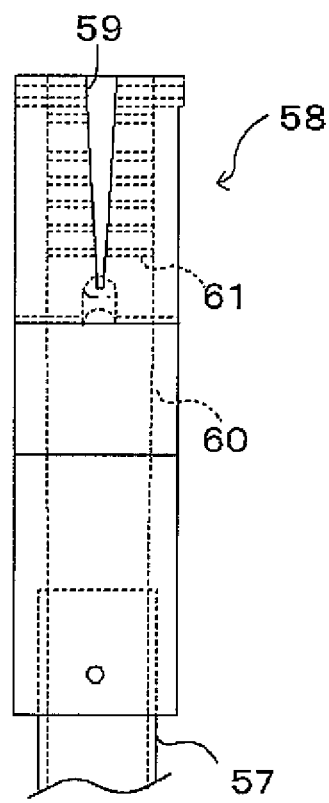
FIGS. 5A and 5B are views showing the shape of an ion supply nozzle of the ion supply device shown in FIG. 4.
Figure 5B:
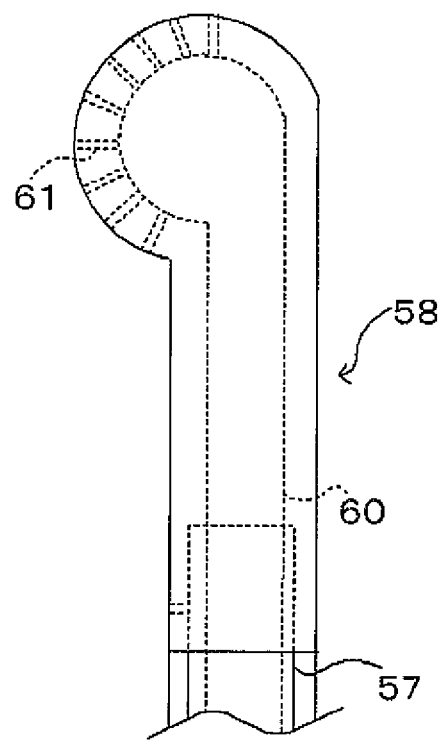

The ion supply nozzle 58 serves to blow the ions (positive ions and negative ions) supplied together with the carrier gas toward electricity removal targets (the wafer boat 42, the semiconductor wafers W, etc.). The configuration of the ion supply nozzle 58 is shown in FIGS. 5A and 5B. FIG. 5A is a front view of the ion supply nozzle 58 and FIG. 5B is a side view thereof.

Referring to FIGS. 5A and 5B, a nozzle opening portion (or a blow-off outlet) may be formed at the end portion of the ion supply nozzle 58, and the ion supply nozzle 58 contains a slit 59 at the nozzle opening portion. The slit 59 is formed to have an increased width as the slit 59 gets distant from the electricity removal target. In the present embodiment, the slit 59 is formed in an inverted taper shape such that the width thereof becomes greater toward the end portion (the upper end portion in FIG. 5A) of the ion supply nozzle 58. Therefore, the greatest amount (e.g., flow rate) of ions is blown from the upper portion of the ion supply nozzle 58, and the smallest amount (e.g., flow rate) of ions is blown from the lower portion of the ion supply nozzle 58. The greatest amount of ions blown from the upper portion of the ion supply nozzle 58 is supplied to an area of the electricity removal target which is placed farthest from the ion supply nozzle 58 (e.g., the upper portion of the wafer boat 42), and the smallest amount of ions blown from the lower portion of the ion supply nozzle 58 is supplied to an area of the electricity removal target which is placed nearest to the ion supply nozzle 58 (e.g., the lower portion of the wafer boat 42). If the distance from the ion supply nozzle 58 to the electricity removal target (e.g., the wafer boat 42) is far, the ions thus supplied are prone to being recombined together. With the ion supply nozzle 58 of the present disclosure, a greater amount of ions is supplied to an area of the electricity removal target where the ions are more likely to be recombined before reaching the area, and a smaller amount of ions is supplied to an area of the electricity removal target where the ions are less likely to be recombined before reaching the another area. This provides an effect of uniformly removing static electricity from the entire area of the electricity removal target such as the wafer boat 42 and the like.

The ion supply nozzle 58 has an internal flow path 60 connected to the ion flow path 57 and a plurality of internal fins (guide plates) 61 provided in the internal flow path 60 near the nozzle opening portion. The internal fins 61 are arranged to uniformly distribute the ions and the carrier gas blown out of the slit 59 over the entire lengthwise area of the slit 59. Since the internal fins 61 are arranged in the internal flow path 60 in this manner, the pressure can be evenly distributed along the lengthwise direction (i.e., the vertical direction) of the ion supply nozzle 58. This provides an effect of uniformly removing static electricity from the entire area of the electricity removal target such as the wafer boat 42 and the like.

In the present embodiment, the internal flow path 60 of the ion supply nozzle 58 has a rectilinear shape. If a bend portion needs to be formed in the internal flow path 60, it is preferred that the internal flow path 60 be gently and smoothly curved in order to prevent the ions from being recombined within the internal flow path 60.

It is preferred that the ion supply nozzle 58 be made of a material which is difficult to consume the ions and superior in heat resistance, e.g., polycarbonate (PC), quartz or polyether ether ketone (PEEK).

Various kinds of sensors may be arranged in the processing chamber 10 of the processing apparatus 1. For example, a sensor for detecting the electrically charged amount of, e.g., the electricity removal target, may be provided within the loading area S2. Further, position sensors such as end limit sensors and base position sensors for detecting the positions of various motors and cylinders may be provided for the corresponding motors and the cylinders. In addition, a plurality of temperature sensors for measuring the internal temperature of the heat treatment furnace 46 and a plurality of pressure sensors for measuring the internal pressure of the heat treatment furnace 46 may be provided to the heat treatment furnace 46.

Figure 6:
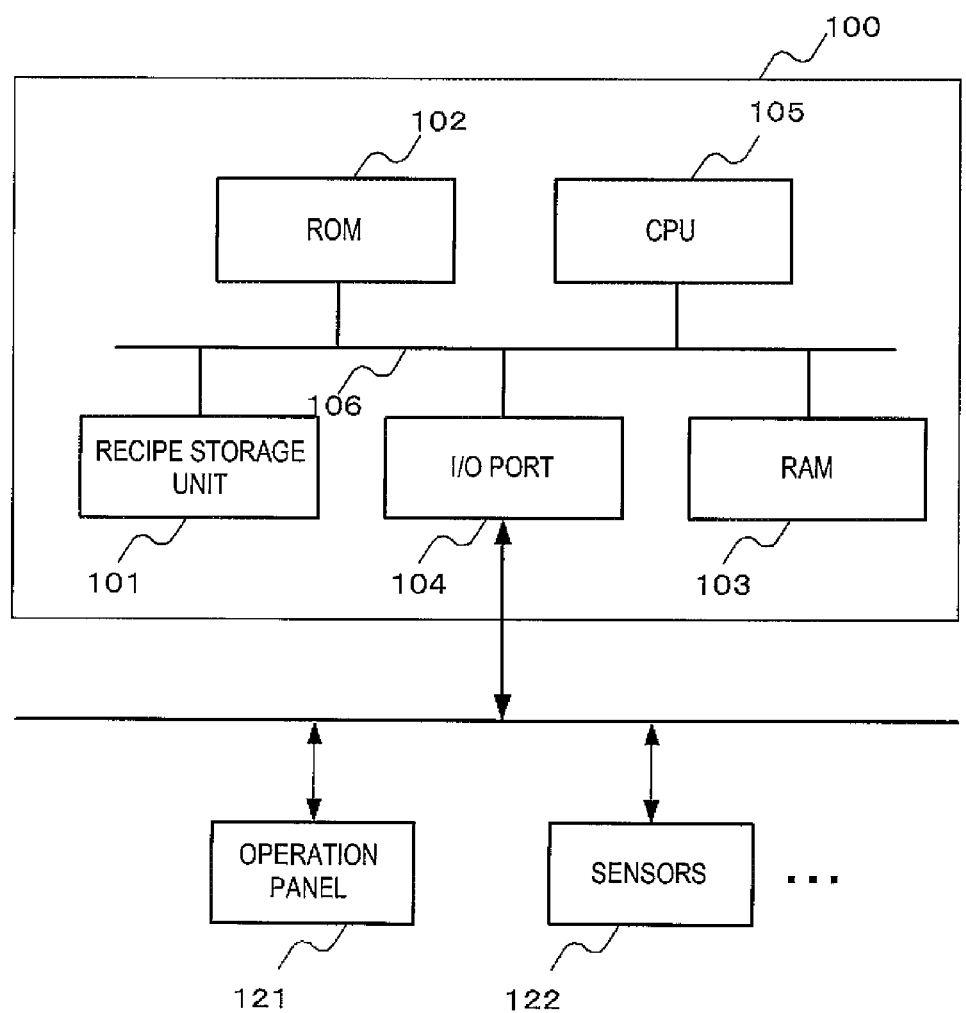
FIG. 6 is a view showing an exemplary configuration of a control system of the processing apparatus shown in FIG. 1.

The processing apparatus 1 is connected to a control system 100 for controlling individual devices or units of the processing apparatus 1. The configuration of the control system 100 is shown in FIG. 6. Referring to FIG. 6, the operation panel 121 and various kinds of sensors 122 such as the electrically charged amount detecting sensor and the like are connected to the control system 100. Based on the data received from the sensors 122 such as the electrically charged amount detecting sensor and the like, the control system 100 outputs control signals to, e.g., the ion supply device 54, etc.

The operation panel 121 includes a display portion (or a display screen) and a plurality of operation buttons. The operation panel 121 transmits the operation instructions of an operator to the control system 100 and displays a variety of information supplied from the control system 100 on the display portion. The sensors 122 such as the electrically charged amount detecting sensor and the like notify the control system 100 of the information detected.

As shown in FIG. 6, the control system 100 includes a recipe storage unit 101, a ROM 102, a RAM 103, an I/O port 104, a CPU 105 and a bus 106 for interconnecting the recipe storage unit 101, the ROM 102, the RAM 103, the I/O port 104 and the CPU 105.

The recipe storage unit 101 stores a plurality of process recipes for determining control sequences pursuant to the kinds of processes to be performed by the processing apparatus 1. The process recipes are respectively prepared for the processes which an operator actually carries out. Operation programs specific to the individual devices or units of the processing apparatus 1 are contained in the process recipes.

The ROM 102 includes, e.g., an EEPROM, a flash memory, a hard disk, etc. The ROM 102 is a storage medium for storing the operation programs of the CPU 105. The RAM 103 serves as, e.g., a work area of the CPU 105. The I/O port 104 inputs, e.g., the information from the sensors 122 to the CPU 105 and outputs the control signals from the CPU 105 to the individual devices or units of the processing apparatus 1.

The CPU 105 makes up the core of the control system 100 and executes the operation programs stored in the ROM 102. In response to the instructions supplied from the operation panel 121, the CPU 105 controls the operation of the processing apparatus 1 in conformity with the process recipes stored in the recipe storage unit 101. Based on the data from the sensors 122 such as the electrically charged amount detecting sensor and the like, the CPU 105 outputs control signals instructing the stops and the startups of the individual devices and units such as the ion supply device 54 and the like. For example, if the detection value of the electrically charged amount detecting sensor is smaller than a predetermined value, the CPU 105 outputs a control signal instructing the stop of the ion supply device 54. The bus 106 transmits information between the individual devices and units.

Next, description will be given on the operation of the processing apparatus 1 configured as above (i.e., the workpiece processing method). In the present embodiment, the operation of the processing apparatus 1 will be described by taking as an example a case where the untreated semiconductor wafers W within the carrier C conveyed from the outside of the working area S1 onto the load port 21 are accommodated into the heat treatment furnace 46 and subjected to heat treatment, after which the heat-treated semiconductor wafers W are conveyed to the load port 21 (and, consequently, outside the work area S1).

First, the control system 100 (specifically, the CPU 105) drives the carrier conveyor 22 to convey the carrier C placed on the load port 21 to the transfer stage 23. Then, the CPU 105 opens the shutter 30. The CPU 105 drives the transfer mechanism 41 to transfer the semiconductor wafers W held within the carrier C placed on the transfer stage 23 into the wafer boat 42 placed on the boat table 45a. If all the semiconductor wafers W within the carrier C are transferred into the wafer boat 42, the CPU 105 drives the carrier conveyor 22 to convey the carrier C placed on the transfer stage 23 back to the load port 21. Then, the CPU 105 conveys the carrier C out of the working area S1. For example, if the number of the semiconductor wafers W that the wafer boat 42 is capable of holding therein is one hundred fifty and if the number of the semiconductor wafers W held in the carrier C is twenty five, the CPU 105 repeats the aforementioned tasks six times. The CPU 105 may store the carrier C holding no semiconductor wafer W in the storage unit 24.

If the number of semiconductor wafers W held in the wafer boat 42 reaches a predetermined number, the CPU 105 closes the shutters 30. Subsequently, the CPU 105 drives the boat transfer mechanism 51 to transfer the wafer boat 42 placed on the boat table 45a onto the cap 50. Upon completing heat treatment on the semiconductor wafers W and unloading the cap 50 on which the wafer boat 42 holding the heat-treated semiconductor wafers W is placed, the CPU 105 transfers the wafer boat 42 to the standby boat table 45b using the lift mechanism 49 and the boat transfer mechanism 51. The operations for the wafer boat 42 after being transferred to the boat table 45b will be described in more detail later. Thereafter, upon finishing the transfer of another wafer boat 42 holding untreated semiconductor wafers W to the cap 50, the CPU 105 drives the lift mechanism 49 to move the cap 50 upwards, thereby loading the wafer boat 42 into the processing vessel 47 of the heat treatment furnace 46.

Once the untreated semiconductor wafers W are loaded into the processing vessel 47, the CPU 105 controls the heat treatment furnace 46 to perform a specified heat treatment, e.g., film-forming or oxidizing and diffusing. If the heat treatment comes to an end, the CPU 105 drives the lift mechanism 49 to move the cap 50 downwards. Consequently, the wafer boat 42 accommodating the heat-treated semiconductor wafers W is moved down and unloaded from the processing vessel 47.

Upon unloading the wafer boat 42 (i.e., the heat-treated semiconductor wafers W), the CPU 105 drives the boat transfer mechanism 51 to transfer the wafer boat 42 placed on the cap 50 onto the boat table 45b. The CPU 105 drives the carrier conveyor 22 to convey the empty carrier C placed on the load port 21 to the transfer stage 23. The conveyance of the empty carrier C to the load port 21 is performed by a transfer mechanism (not shown). Then, the CPU 105 opens the shutter 30 and drives the transfer mechanism 41 to bring the heat-treated semiconductor wafers W from the wafer boat 42 placed on the boat table 45b to the carrier C placed on the transfer stage 23.

When the transfer mechanism 41, the boat transfer mechanism 51 and the like are driven within the loading area S2, the semiconductor wafers W, the carrier C holding the semiconductor wafers W and the wafer boat 42 are charged with static electricity. Likewise, the fine particles (e.g., dust) existing within the loading area S2 are also prone to being charged with static electricity. In the present embodiment, however, the ion supply device 54 is arranged within the loading area S2 to emit positive ions and negative ions. As a result, the static electricity of the electrically charged areas of devices and units and the electrically charged floating particles is removed, which makes it possible to prevent the particles from adhering to the semiconductor wafers W.

In this connection, the slit 59 of inverted taper shape with a width becoming greater toward the end portion of the ion supply nozzle 58 is formed at the nozzle opening portion of the ion supply nozzle 58 of the ion supply device 54. This provides an effect of uniformly removing static electricity from the entire area of the electricity removal target such as the wafer boat 42.

Since the ion supply nozzle 58 includes the internal fins 61 arranged in the internal flow path 60 near the nozzle opening portion, it is possible to supply ions and a carrier gas having directivity with respect to the electricity removal target. This provides an effect of uniformly removing static electricity from the entire area of the electricity removal target such as the wafer boat 42.

The electricity charging condition within the loading area S2 is detected by the electrically charged amount detecting sensor (not shown) at all times. If the detection value of the electrically charged amount detecting sensor is smaller than a predetermined value, the CPU 105 can stop the operation of the ion supply device 54. This makes it possible to prevent unnecessary consumption of the carrier gas and the like.

If a specified number of semiconductor wafers W are held within the carrier C, the CPU 105 drives the carrier conveyor 22 to convey the carrier C placed on the transfer stage 23 to the load port 21. The CPU 105 conveys the carrier C to the outside of the work area S1. If all semiconductor wafers W held in the wafer boat 42 are conveyed to the outside of the working area S1, the CPU 105 closes the shutter 30 and finishes this conveyance process.

As described above, according to the present embodiment, the slit 59 of inverted taper shape with a width becoming greater toward the end portion of the ion supply nozzle 58 is formed at the nozzle opening portion of the ion supply nozzle 58. This provides an effect of uniformly removing static electricity from the entire area of the electricity removal target such as the wafer boat 42.

According to the present embodiment, the ion supply nozzle 58 includes the internal fins 61 arranged in the internal flow path 60 near the nozzle opening portion. This provides an effect of uniformly removing static electricity from the entire area of the electricity removal target such as the wafer boat 42.

The present disclosure is not limited to the embodiment described above but may be modified or applied in many different forms. Other embodiments applicable to the present disclosure will be described below.

While the present embodiment has been described by taking as an example the case where the slit 59 is formed into an inverted taper shape with a width becoming greater toward the end portion of the ion supply nozzle 58, it is only necessary that the slit 59 be formed to have an increased width as the slit 59 gets distant from the electricity removal target. The shape of the slit 59 may be arbitrarily changed depending on the position and size of the electricity removal target.

While the present embodiment has been described by taking as an example the case where an ionizer is used as the ion generator 55, it is only necessary that the ion generator 55 be capable of generating ions for removal of static electricity. Other ion generators may be used in place of the ionizer.

While the present embodiment has been described by taking as an example the case where the workpieces are the semiconductor wafers W, the present disclosure may be applied to the processing of, e.g., FPD substrates, glass substrates or PDP substrates.

The control system 100 employed in the embodiments of the present disclosure can be realized using a typical computer system instead of a dedicated control system. For example, the control system 100 for performing the aforementioned processes can be configured by installing programs for execution of the processes into a general-purpose computer through the use of a recording medium (e.g., a flexible disk or a CD-ROM) storing the programs.

The programs can be provided by an arbitrary means. The programs may be provided not only by the recording medium mentioned above but also through a communication line, a communication network or a communication system. In the latter case, the program at issue may be posted on bulletin board system (BBS) and provided through a network being carried by carrier waves. The program thus provided is started up and executed in the same manner as other application programs under the control of an operating system, thereby performing the processes described above.

The present disclosure can find its application in an apparatus for processing workpieces.

According to the present disclosure, it is possible to attain an effect of uniformly removing static electricity over a wide area.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. An ion supply device, comprising:
   an ion generator for generating ions for removing static electricity;
   a carrier gas supply unit for supplying to the ion generator a carrier gas for carrying the ions generated in the ion generator; and
   an ion supply nozzle for blowing the ions and the carrier gas from the ion generator through a blow-off opening toward an electricity removal target from which static electricity is to be removed,
   wherein a slit is provided at the blow-off opening, the slit having an increased width as the slit gets distant from the electricity removal target,
   wherein the ion supply nozzle includes an internal flow path and a plurality of internal fins provided at a portion of the internal flow path near the blow-off opening so that the ions and the carrier gas blown from the slit is uniformly distributed along a lengthwise direction of the slit.

2. The device of claim 1, wherein the slit is formed in an inverted taper shape with a width increasing toward a tip end of the ion supply nozzle.

3. The device of claim 1, wherein the ion supply nozzle is made of at least one material selected from the group consisting of polycarbonate, quartz and polyether ether ketone (PEEK).

4. The device of claim 1, wherein the ion generator is an ionizer.

* * * * *